United States Patent
Inoue

(10) Patent No.: US 7,492,202 B2
(45) Date of Patent: Feb. 17, 2009

(54) FLIP-FLOP CIRCUIT

(75) Inventor: Genichiro Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/978,201

(22) Filed: Oct. 29, 2007

(65) Prior Publication Data
US 2008/0074161 A1  Mar. 27, 2008

Related U.S. Application Data

(62) Division of application No. 11/136,557, filed on May 25, 2005, now abandoned.

(30) Foreign Application Priority Data
Jun. 17, 2004  (JP) .............................. 2004-179954

(51) Int. Cl.
*H03K 3/356* (2006.01)
(52) U.S. Cl. .................. 327/203; 327/218; 327/112
(58) Field of Classification Search ................ 327/202, 327/203
See application file for complete search history.

(56) References Cited

U.S. PATENT DOCUMENTS

| | | | |
|---|---|---|---|
| 5,656,962 A * | 8/1997 | Banik ..................... | 327/202 |
| 5,905,393 A | 5/1999 | Rinderknecht et al. | |
| 6,614,276 B2 | 9/2003 | Robertson et al. | |
| 2003/0218231 A1 * | 11/2003 | Sani et al. .................. | 257/500 |

FOREIGN PATENT DOCUMENTS

| | | |
|---|---|---|
| CN | 1337781 A | 2/2002 |
| EP | 0 567 716 A1 | 11/1993 |
| JP | 60-224319 | 11/1985 |
| JP | 5-63555 | 3/1993 |
| JP | 5-152904 | 6/1993 |
| JP | 8-195650 | 7/1996 |

OTHER PUBLICATIONS

Chinese Office Action issued in Chinese Patent Application No. CN 200510077214X dated Aug. 3, 2007.

* cited by examiner

*Primary Examiner*—Long Nguyen
*Assistant Examiner*—Ryan C Jager
(74) *Attorney, Agent, or Firm*—McDermott Will & Emery LLP

(57) ABSTRACT

To keep input capacitance and driving capability at respective data input and output terminals of a flip-flop circuit, the flip-flop includes: a master latch portion; a slave latch portion; and a data output selecting portion. The master latch portion includes a tri-state inverter, which is connected to the input terminal. The data output selecting portion is constituted by two pass gates and an inverter, which is connected to the output terminal. The input capacitance of the flip-flop circuit is determined by gate capacitances of transistors constituting the tri-state inverter connected to the input terminal. The driving capability of the flip-flop circuit is determined by the driving capability of the inverter connected to the output terminal. Accordingly, both the input capacitance and the driving capability are kept constant, irrespective of the state of a timing signal such as a clock signal.

9 Claims, 7 Drawing Sheets

FLIP-FLOP CIRCUIT

CROSS-REFERENCE TO RELATED APPLICATION

This application is a Divisional of U.S. application Ser. No. 11/136,557, filed May 25, 2005, now abandoned claiming priority of Japanese Patent Application No. 2004-179954, filed on Jun. 17, 2004, the entire contents of each of which are hereby incorporated by reference.

BACKGROUND OF THE INVENTION

The present invention mainly relates to flip-flop circuits constituted by transistors formed as semiconductor integrated circuits (LSIs).

Performances required of recent LSIs have been rapidly enhanced in recent years, and LSI manufacturers have competed to achieve higher functionality and higher operation speed. LSI circuits for use in synchronous digital signal processing, for example, are designed to use flip-flop circuits as necessary components. Therefore, to achieve faster LSI circuits, every manufacturer has to increase the speed of flip-flop circuits.

In view of this, various configurations of flip-flop circuits for high speed operation have been proposed to date. For example, a circuit configuration including a bypass circuit for allowing an input signal to be output without change in addition to a master latch and a slave latch is known (see, for example, U.S. Pat. No. 5,656,962 (FIG. 5)).

More specifically, the flip-flop circuit includes: a master portion 205 including a master latch; a slave portion 206 including a slave latch; and a bypass 207, as shown in FIG. 5 of this patent.

The master portion 205 includes a pass gate 310, an inverter 311 and an inverter 312. The master portion 205 holds data input from a data input terminal 209 in synchronization with a clock signal input from a clock signal input terminal while the clock signal is at an H (high) level.

The slave portion 206 holds data output from the master portion 205 and allows the data to be output via an inverter 315 and a pass gate 519 while the clock signal is at an L (low) level.

The bypass 207 includes an inverter 316 and a pass gate 317. The bypass 207 outputs data held in the master portion 205 while the clock signal is at the H (high) level.

That is, in the period after the clock signal has risen and before the clock signal falls, the pass gate 317 of the bypass 207 allows data to pass through. On the other hand, in the period after the clock signal has fallen and before the clock signal rises, the pass gate 519 of the slave portion 206 allows data to pass through and to be output from a data output terminal 208. In this manner, at the rising edge of the clock signal, data from the master portion 205 is output via the bypass 207, which operates faster than the slave portion 206, thereby enabling the data to be output from the data output terminal 208 in a short time.

In the conventional flip-flop circuit, however, physical characteristics at the input and output terminal(s) 208 and/or 209 (i.e., an input capacitance with respect to the data input terminal 209 and/or an output driving capability with respect to the data output terminal 208) vary depending on the state of the clock signal. Therefore, the flip-flop circuit has a drawback in which it is difficult to design and develop a circuit including such a flip-flop circuit in a short period.

Specifically, the input capacitance at the data input terminal 209 is described as follows. When the clock signal is "1" (e.g., at the H level), the pass gate 310 at the input of the master portion 205 is closed. Accordingly, the input capacitance at the data input terminal 209 is equal to the source capacitance of the pass gate 310. On the other hand, when the clock signal is "0" (e.g., at the L level), the pass gate 310 is open. Accordingly, the input capacitance at the data input terminal 209 is equal to the sum of the source and drain capacitances of the pass gate 310, the gate capacitance of the inverter 311, the gate capacitance of the inverter 316 and the drain capacitance of the inverter 312, i.e., is different from that when the clock signal is "1".

The driving capability at the data output terminal 208 is described as follows. When the clock signal is "0", the inverter 315 of the slave portion 206 drives a subsequent circuit connected to the data output terminal 208 (via the pass gate 519). On the other hand, when the clock signal is "1", the inverter 316 of the bypass 207 drives the subsequent circuit (via the pass gate 317) with a driving capability different from that when the clock signal is "0".

In recent LSI markets, rapid development of LSI circuits and introduction thereof to the markets by using techniques allowing short-term development are much more required than before. To achieve the short-term development of LSI circuits, a circuit design technique using physical-characteristic-extracted data at a logic gate level (i.e., at the level of a circuit such as a flip-flop circuit) is generally more advantageous than a circuit design technique using physical-characteristic-extracted data at a transistor level. Specifically, standard cells corresponding to logic gates such as a flip-flop, a NAND, an inverter and an AND are registered in a library. Then, a cell-base design combining these standard cells is applied to design an LSI circuit, thus enabling the LSI circuit to be designed in a short period.

However, in the case where physical characteristics at the input and output vary depending on the state of a clock signal as described above, it is difficult to extract physical characteristics that are to be registered in a library as those of standard cells. If physical characteristics associated with the respective states of the clock signal are extracted and registered in the library, different operations are needed for the respective states of the clock signal during a timing verification of a circuit using such cells, so that processing becomes very complicated. Therefore, a circuit design using the cell-base design as described above is difficult in reality. In these circumstances, it has been impossible to design and develop circuits including flip-flop circuits in short periods.

SUMMARY OF THE INVENTION

It is therefore an object of the present invention to keep physical characteristics at input and output terminals of a flip-flop circuit constant, irrespective of the state of a timing signal such as a clock signal.

In order to achieve this object, a flip-flop circuit according to the present invention includes: an input terminal to which an input signal is input; a master latch portion for holding a signal input from the input terminal immediately before a timing signal changes from a first state to a second state, while the timing signal is in the second state; a slave latch portion for holding a signal input from the master latch portion immediately before the timing signal changes from the second state to the first state, while the timing signal is in the first state; and an output terminal from which a signal according to a signal held in the master latch portion is output when the timing signal is in the second state and a signal according to a signal held in the slave latch portion is output when the timing signal is in the first state. At least one of an input capacitance at the input terminal and a driving capability at the output terminal when the timing signal is in the first state is equal to that when the timing signal is in the second state.

With this configuration, a signal input immediately before a timing signal changes from a first state to a second state is output with a short delay and, in addition, input capacitance and/or driving capability are/is constant irrespective of the state of the timing signal. Accordingly, the input capacitance and the driving capability are easily extracted as those of a standard cell and circuit design is completed in a short period.

The flip-flop circuit may include a selecting portion for selecting a signal according to a signal held in the master latch portion or the slave latch portion and outputting the selected signal. The selecting portion may be configured by using tri-state elements which have the same driving capability in their active states (i.e., in the states where the outputs thereof are not in high-impedance states) and only one which is active at a time. Alternatively, the selecting portion may be configured by using pass gates only one of which is active at a time and a driver receiving the outputs of these pass gates.

An input signal may be input to, for example, a tri-state element, which is not an element such as a pass gate whose electrical connecting state changes, i.e., may be input not to the sources and drains of transistors constituting an element, for example, but only to the gates thereof.

If a tri-state inverter or an inverter is used as the tri-state element or the driver described above, a signal at a desired level is easily held and output without the use of additional inverter.

DESCRIPTION OF THE PREFERRED EMBODIMENTS

Figure 1:
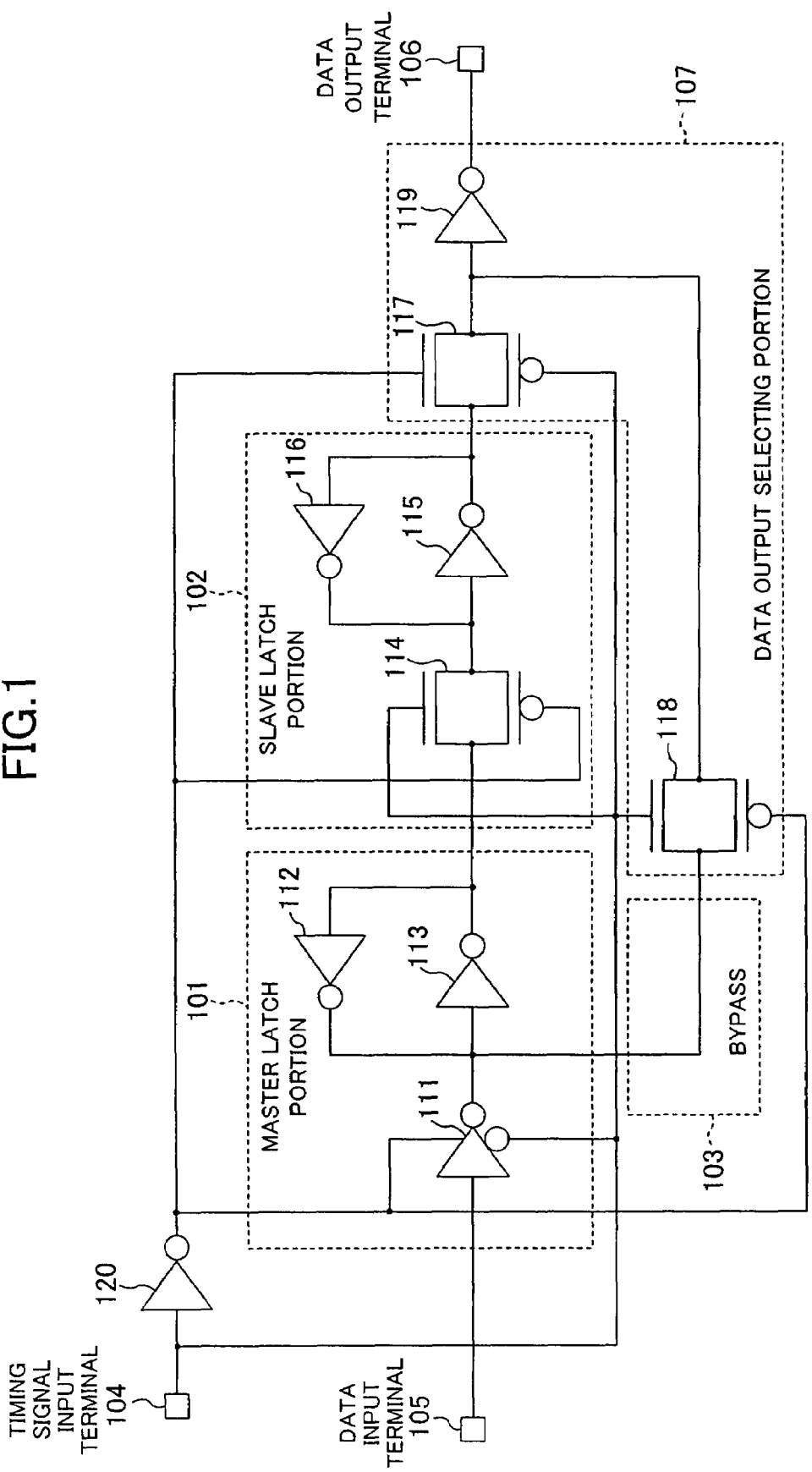
FIG. 1 is a circuit diagram illustrating a configuration of a flip-flop circuit according to a first embodiment.

Hereinafter, embodiments of the present invention will be specifically described with reference to the drawings.

In the following embodiments, components having similar functions are denoted by the same reference numerals, and the descriptions thereof will be omitted.

Embodiment 1

FIG. 1 is a circuit diagram illustrating a flip-flop circuit according to a first embodiment of the present invention.

A master latch portion 101 includes: a tri-state inverter 111; an inverter 112; and an inverter 113. The master latch portion 101 performs latch operation for allowing data to be written therein when a timing signal input from a timing signal input terminal 104 is "0" (e.g., at an L level) and holding data when the timing signal is "1" (e.g., at an H level). The inverter 112 has a driving capability lower than that of the tri-state inverter 111.

A slave latch portion 102 includes: a pass gate 114; an inverter 115; and an inverter 116. The slave latch portion 102 holds data when the timing signal is "0" and allows data to be written therein when the timing signal is "1". The inverter 116 has a driving capability lower than that of the tri-state inverter 113 connected thereto via the pass gate 114.

A bypass 103 is a signal line for outputting data written and held in the master latch portion 101 such that the data does not pass through the slave latch portion 102, thus reducing the delay time, as compared to a case where the data is output by way of the slave latch portion 102.

A data output selecting portion 107 includes: a pass gate 117; a pass gate 118; and an inverter 119. The data output selecting portion 107 selects one of the output of the slave latch portion 102 and the output of the bypass 103 according to a timing signal input from the timing signal input terminal 104 and allows the selected signal to be output from a data output terminal 106. More specifically, the output of the slave latch portion 102 is selected when the timing signal is "0" and the output of the bypass 103 is selected when the timing signal is "1".

An inverter 120 generates an inverted signal of a timing signal input from the timing signal input terminal 104.

With the foregoing configuration, data (a signal) input from a data input terminal 105 is input to a latch constituted by the inverters 112 and 113 via the tri-state inverter 111. That is, only the gate terminals of transistors constituting the tri-state inverter 111 are electrically connected to the data input terminal 105 irrespective of the state of the timing signal, so that the input capacitance is kept constant.

In both cases where the pass gate 117 conducts and where the pass gate 118 conducts, the output signal from the pass gate 117 or 118 is output to the data output terminal 106 via the inverter 119. That is, the driving capability of the flip-flop circuit is determined by the driving capability of the inverter 119 and, therefore, is kept constant irrespective of the state of the timing signal.

Accordingly, the characteristics of a flip-flop circuit as described above are easily extracted so that the flip-flop circuit is used for a cell-base deign as a standard cell. The use of a cell library including the flip-flop circuit used as such a standard cell enables circuit design to be completed in a short period.

Data holding operation of the flip-flop circuit itself is performed in the same manner as the conventional flip-flop circuit as follows.

When the timing signal is "0", the master latch portion 101 performs data writing operation so that a signal input from the data input terminal 105 is written in the master latch portion 101. The slave latch portion 102 performs data holding operation so that the output of the slave latch portion 102 does not change from the state immediately before the timing signal changes to "0". The bypass 103 transmits the signal written in the master latch portion 101 to the data output selecting portion 107. However, the data output selecting portion 107 selects the data output from the slave latch portion 102 and causes the selected data to be output from the data output terminal 106. That is, irrespective of the value input to the data input terminal 105, data held in the slave latch portion 102 is continuously output from the data output terminal 106.

On the other hand, when the timing signal transitions from "0" to "1", the master latch portion 101 shifts from data writing operation to data holding operation so that the value input to the data input terminal 105 immediately before the timing signal transitions from "0" to "1" is held in the master latch portion 101. The slave latch portion 102 shifts from data holding operation to data writing operation and, after the timing signal has transitioned from "0" to "1", the output of the master latch portion 101 is written in the slave latch portion 102. The bypass 103 transmits the signal held in the master latch portion 101 to the data output selecting portion 107. The data output selecting portion 107 shifts from the state of selecting the output of the slave latch portion 102 to the state of selecting the signal transmitted from the bypass 103. That is, the state where the value held in the slave latch portion 102 is output from the data output terminal 106 changes to the state where the value input to the data input terminal 105 immediately before the timing signal transitions from "0" to "1" is output by way of the master latch portion 101 and the bypass 103 (i.e., is not output by way of the slave latch portion 102).

In this manner, the signal is transmitted by way of the bypass 103, so that the delay time from the rising edge of the timing signal to the time when the value input to the data input terminal 105 at the rising edge is output from the data output terminal 106 is reduced as compared to the case where the signal is transmitted by way of the slave latch portion 102.

When the timing signal is "1", the master latch portion 101 performs data holding operation, so that the output of the master latch portion 101 is unchanged. The slave latch portion 102 performs data writing operation. However, since the output of the master latch portion 101 as an input does not change, the output of the slave latch portion 102 does not change either. The bypass 103 continues to transmit the signal held in the master latch portion 101 to the data output selecting portion 107. The data output selecting portion 107 selects the output of the bypass 103 and outputs the data held in the master latch portion 101 to the data output terminal 106. That is, irrespective of the value at the data input terminal 105, data held in the master latch portion 101 is continuously output.

When the timing signal transitions from "1" to "0", the master latch portion 101 shifts from data holding operation to data writing operation. After the timing signal has transitioned from "1" to "0", the value input to the data input terminal 105 is written in the master latch portion 101. The slave latch portion 102 shifts from data writing operation to data holding operation and the output of the master latch portion 101 immediately before the timing signal transitions from "1" to "0" is written and held in the slave latch portion 102. The bypass 103 transmits the signal written in the master latch portion 101. However, the data output selecting portion 107 shifts from the state of selecting the signal transmitted from the bypass 103 to the state of selecting the output of the slave latch portion 102. That is, the value held in the master latch portion 101 when the timing signal is "1" comes to be held in the slave latch portion 102 and is selected by the data output selecting portion 107. Accordingly, the output from the data output terminal 106 does not change from the state when the timing signal is "1".

As described above, at the rising edge of the timing signal, flip-flop operation in which the value input to the data input terminal 105 is written and output from the data output terminal 106 is performed. In addition, an output is produced at a high speed at the rising edge of the timing signal.

Furthermore, the input capacitance and the driving capability are kept constant as described above, so that circuit design is completed in a short period with physical characteristics extracted as those of a standard cell.

Embodiment 2

Figure 2:
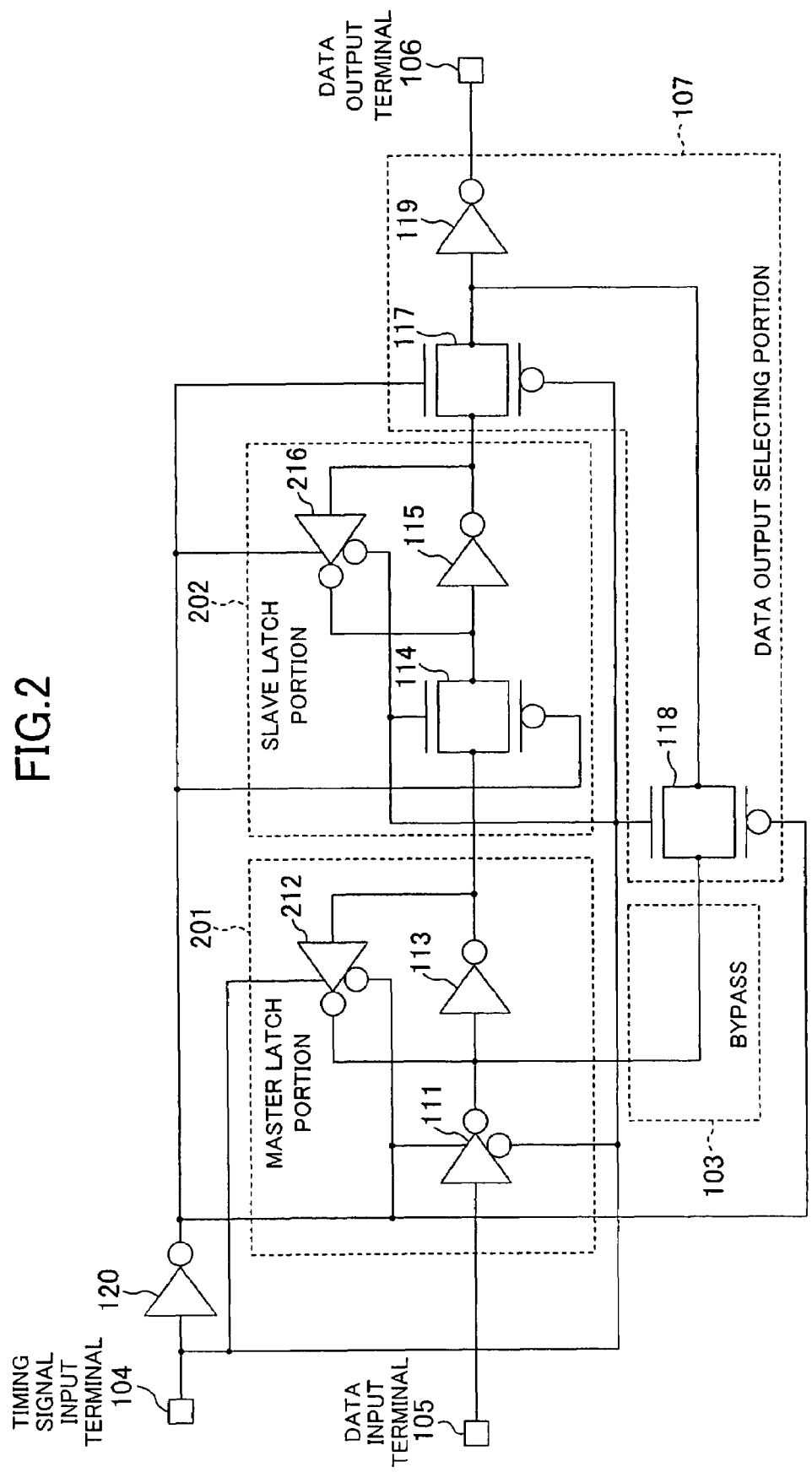
FIG. 2 is a circuit diagram illustrating a configuration of a flip-flop circuit according to a second embodiment.

Instead of the master latch portion 101 and the slave latch portion 102 including the inverters 112 and 116, respectively, of the first embodiment, a master latch portion 201 and a slave latch portion 202 including tri-state inverters 212 and 216, respectively, may be used as shown in FIG. 2.

The tri-state inverters 212 and a tri-state inverter 111 operate at different states of a timing signal, and the tri-state inverter 216 and a pass gate 114 also operate at different states of the timing signal. Accordingly, the outputs of the tri-state inverter 212 and the tri-state inverter 111 do not conflict with each other, and the outputs of the tri-state inverter 216 and the pass gate 114 do not conflict with each other.

With this configuration, holding operation of input data itself is also the same as that in the conventional flip-flop circuit, as described in the first embodiment.

In addition, irrespective of the state of the timing signal, only the gate terminals of transistors constituting the tri-state inverter 111 are electrically connected to a data input terminal 105 and the driving capability of the flip-flop circuit is determined by the driving capability of an inverter 119, so that the input capacitance and the driving capability are kept constant as in the first embodiment. Accordingly, it is also easy to extract physical characteristics as those of a standard cell. The use of a cell library including the flip-flop circuit as such a standard cell enables circuit design to be completed in a short period.

Embodiment 3

Figure 3:
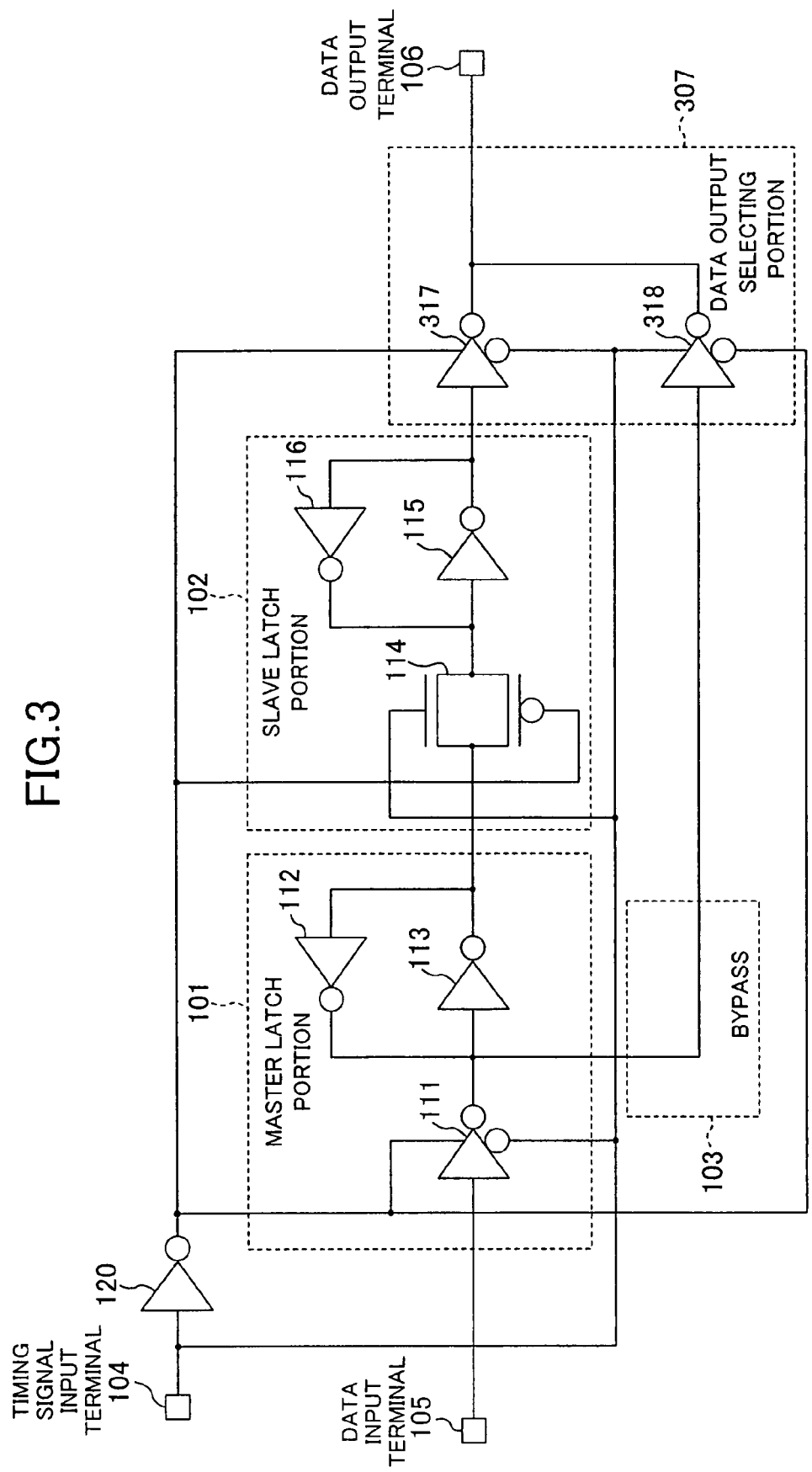
FIG. 3 is a circuit diagram illustrating a configuration of a flip-flop circuit according to a third embodiment.

Instead of the data output selecting portion 107 of the first embodiment, a data output selecting portion 307 including tri-state inverters 317 and 318 may be provided as shown in FIG. 3. When the value of a timing signal is "0", the tri-state inverters 317 and 318 select the output of a slave latch portion 102 (i.e., the tri-state inverter 317 is active and the tri-state inverter 318 is in a high-impedance state). On the other hand, when the value of the timing signal is "1", the tri-state inverters 317 and 318 select the output from a bypass 103 (i.e., the tri-state inverter 317 is in a high-impedance state and the tri-state inverter 318 is active).

In this embodiment, the tri-state inverters 317 and 318 have the same driving capability (physical characteristic). Specifically, elements (transistors) constituting these inverters are designed to have the same size and shape, for example. That is, the driving capability of the tri-state inverter 317 does not affect the response ability when the timing signal rises and, therefore, the driving capability can be set small. However, in this embodiment, the tri-state inverter 317 is intentionally designed to have the same driving capability as that of the tri-state inverter 318 so that the driving capability of the flip-flop circuit is unchanged irrespective of which of the tri-state inverters 317 and 318 is active. This also enables easy extraction of physical characteristics as those of a standard cell. The use of a cell library including the flip-flop circuit as such a standard cell enables circuit design to be completed in a short period.

Figure 4:
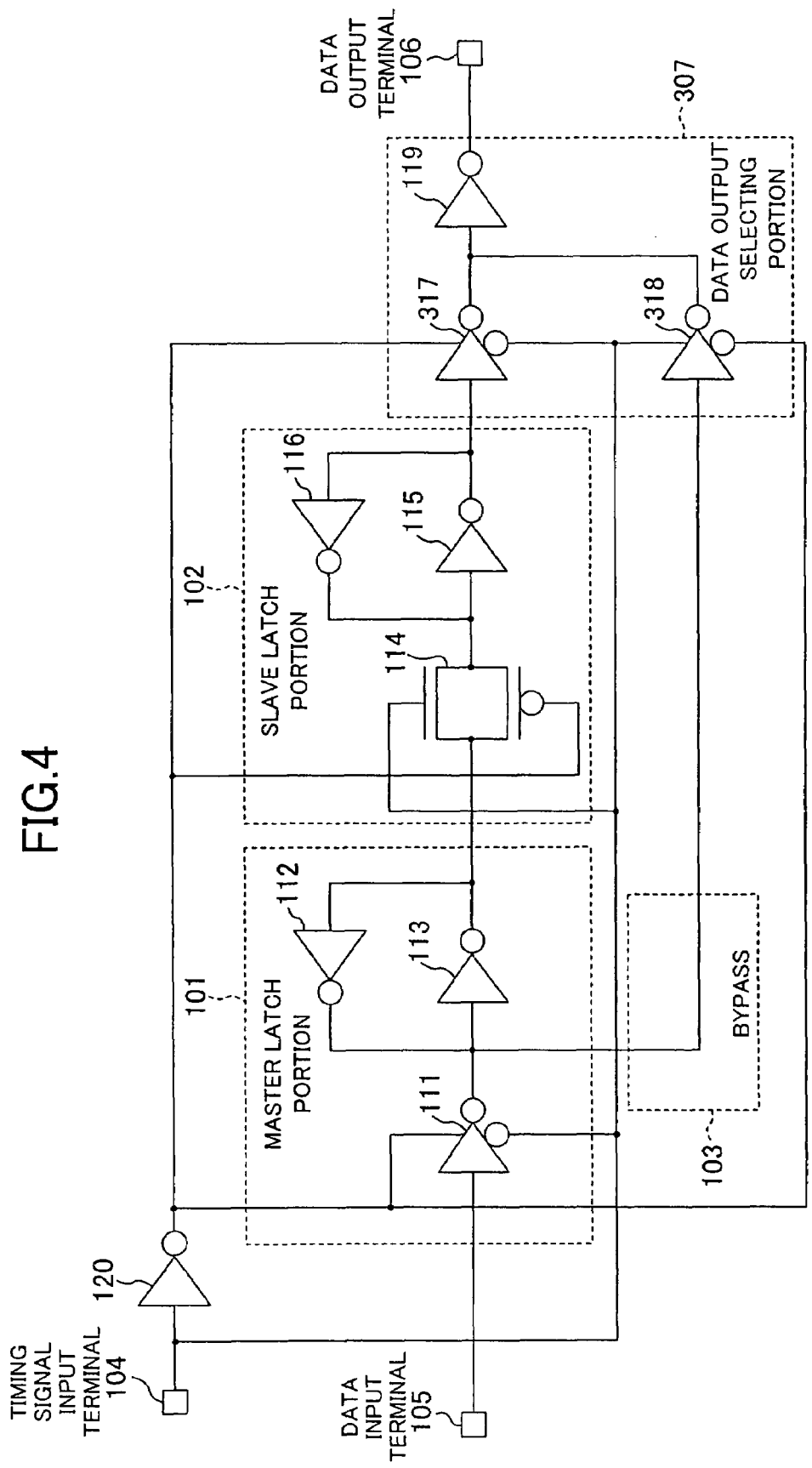
FIG. 4 is a circuit diagram illustrating a configuration of a flip-flop circuit according to a modified example of the third embodiment.

In the case where the tri-state inverters 317 and 318 are used as described above, an output driver such as an inverter 119 or a buffer may be provided between the tri-state inverters 317 and 318 and a data output terminal 106 as shown in FIG. 4, as in the first and second embodiments. In this case, even if the tri-state inverters 317 and 318 have different driving abilities, the driving capability of the flip-flop circuit is kept constant. However, if the tri-state inverters 317 and 318 are designed to have the same driving capability and the inverter 119 and other elements are not provided, the flip-flop circuit operates at a higher speed because of the absence of a delay caused by the inverter 119 and other elements.

Embodiment 4

Figure 5:
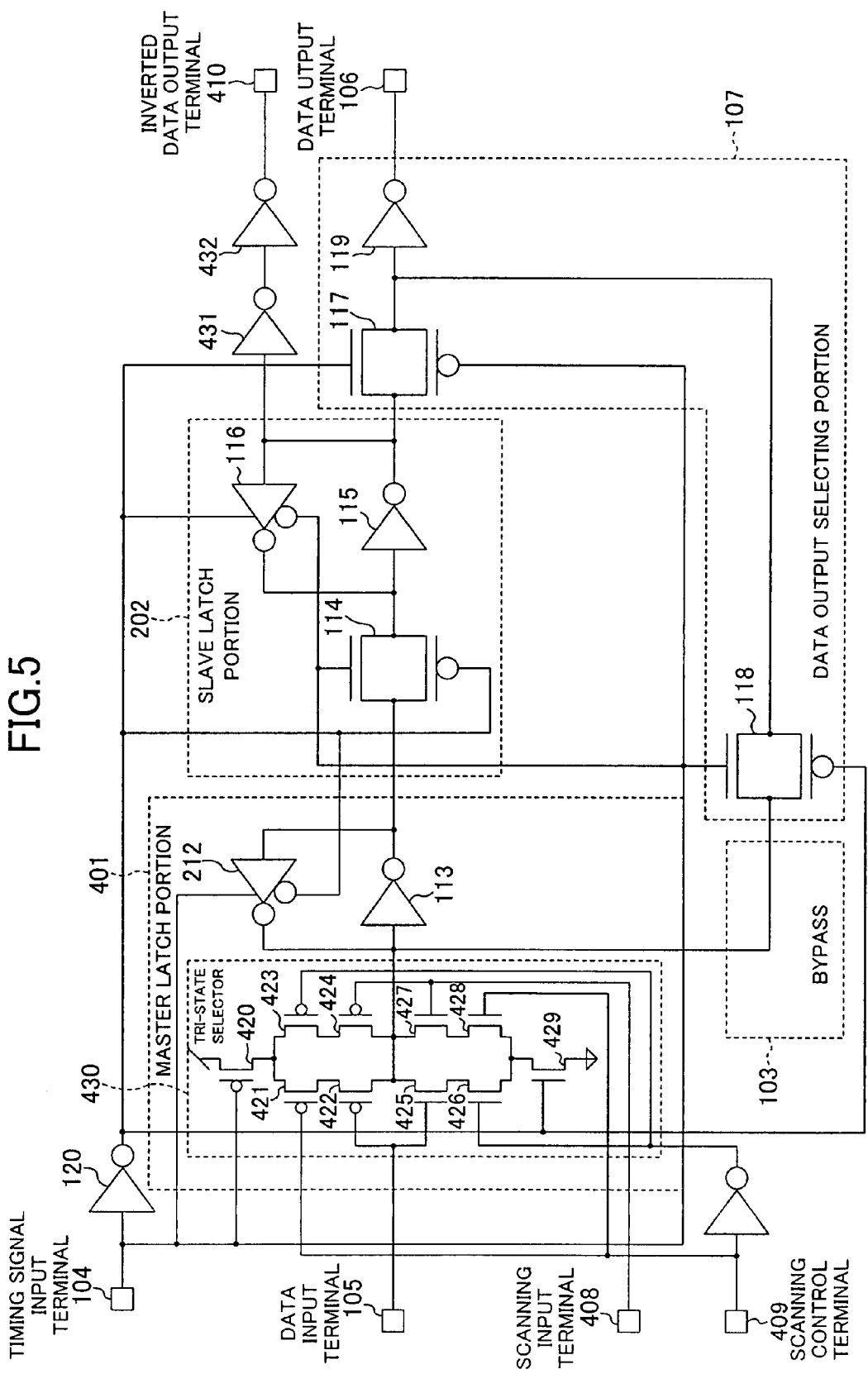
FIG. 5 is a circuit diagram illustrating a configuration of a flip-flop circuit according to a fourth embodiment.

An example of a flip-flop circuit usable for, for example, a scanning test for a semiconductor integrated circuit will be described. As shown in FIG. 5, this flip-flop circuit includes a master latch portion 401 including a tri-state selector 430 instead of the master latch portion 101 including the tri-state inverter 111 of the second embodiment (FIG. 2). An inverted data output terminal 410 is connected to the output of a slave latch portion 202 via serially-connected inverters 431 and 432 so as to output an inverted signal of a signal output from a data output terminal 106.

The tri-state selector 430 includes PMOS transistors (p-type MOS transistors) 420 through 424 and NMOS transistors (n-type MOS transistors) 425 through 429. When a timing signal is "1", the output of the tri-state selector 430 is in a high-impedance state as the tri-state inverter 111 of the first and second embodiments. On the other hand, when the timing signal is "0", the tri-state selector 430 outputs an inverted signal of one of a data signal input from a data input terminal 105 and a scanning test signal input from a scanning input terminal 408 according to a scanning control signal input from a scanning control terminal 409 (i.e., operates as a tri-state inverter having a selecting function). More specifically, when the scanning control signal is "0", the tri-state selector 430 operates as the tri-state inverter 111 shown in FIG. 2 and when the scanning control signal is "1", the tri-state selector 430 operates in the same manner with respect to a signal input from the scanning input terminal 408.

With this configuration, only the gate terminals of transistors constituting the tri-state selector 430 are electrically connected to the data input terminal 105 and the scanning input terminal 408 irrespective of the state of the timing signal, so that the input capacitance is kept constant. In addition, since the driving capability of the flip-flop circuit is determined by the driving capability of an inverter 119, the driving capability of the flip-flop circuit is also kept constant irrespective of the state of the timing signal.

The inverted signal output from the inverted data output terminal 410 may be generated based on the output of a pass gate 117 or the inverter 119 so as to reduce a delay in the same manner as that for an output signal from the data output terminal 106. In a case where the speed in outputting a signal from the inverted data output terminal 410 does not need to be increased so much as in the case of a scanning test for a semiconductor integrated circuit, for example, this signal can be generated based on the output of the slave latch portion 202 as described above. This suppresses loads such as a pass gate 118 and easily ensures a high-speed output of a signal from the data output terminal 106 without the need for increasing the driving capability.

The output of the inverter 431 may be directly connected to the output terminal (i.e., without insertion of the inverter 432) so that signals having the same logic value are individually output from the inverted data output terminal 410 and the data output terminal 106. In this case, the signal output from the data output terminal 106 is only used for driving circuits which need high speed operation whereas the signal output from the inverted data output terminal 410 is used for driving circuits which do not need especially high speed operation.

Embodiment 5

Figure 6:
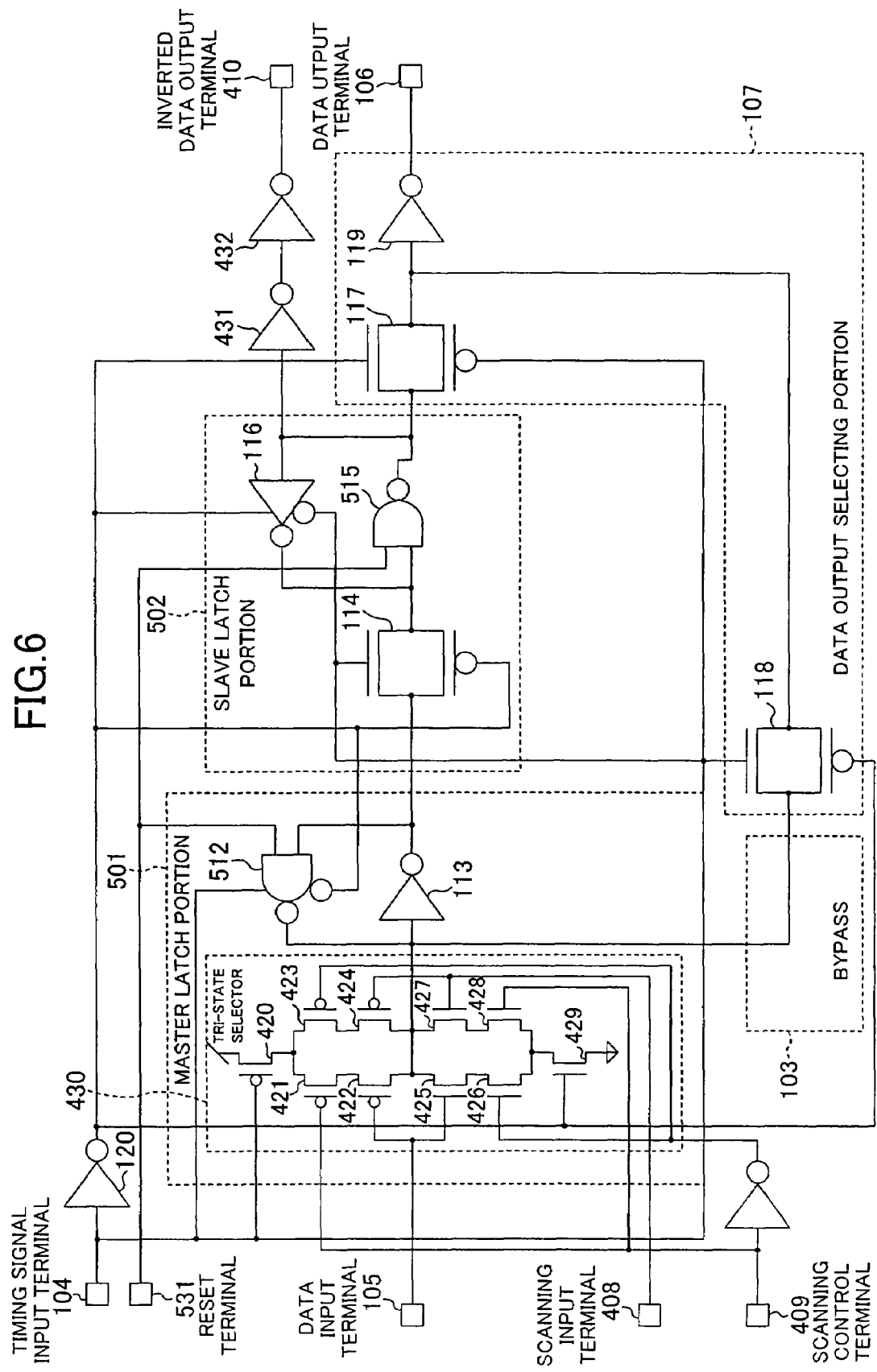
FIG. 6 is a circuit diagram illustrating a configuration of a flip-flop circuit according to a fifth embodiment.

As shown in FIG. 6, instead of the master latch portion 401 and the slave latch portion 202 of the fourth embodiment, a master latch portion 501 and a slave latch portion 502 including a tri-state inverter 512 and a NAND 515, respectively, may be provided to implement a reset function. With this configuration, when a reset signal input from a reset terminal 531 transitions to "0", reset operation in which "0" is output from a data output terminal 106 is performed, as in a conventional flip-flop circuit having a reset function.

In the foregoing configuration, a data input terminal 105 and a scanning input terminal 408 are connected to a tri-state selector 430 and the data output terminal 106 is connected to an inverter 119 as in the fourth embodiment, so that the input capacitance and the driving capability are kept constant irrespective of the state of a timing signal.

Embodiment 6

Figure 7:
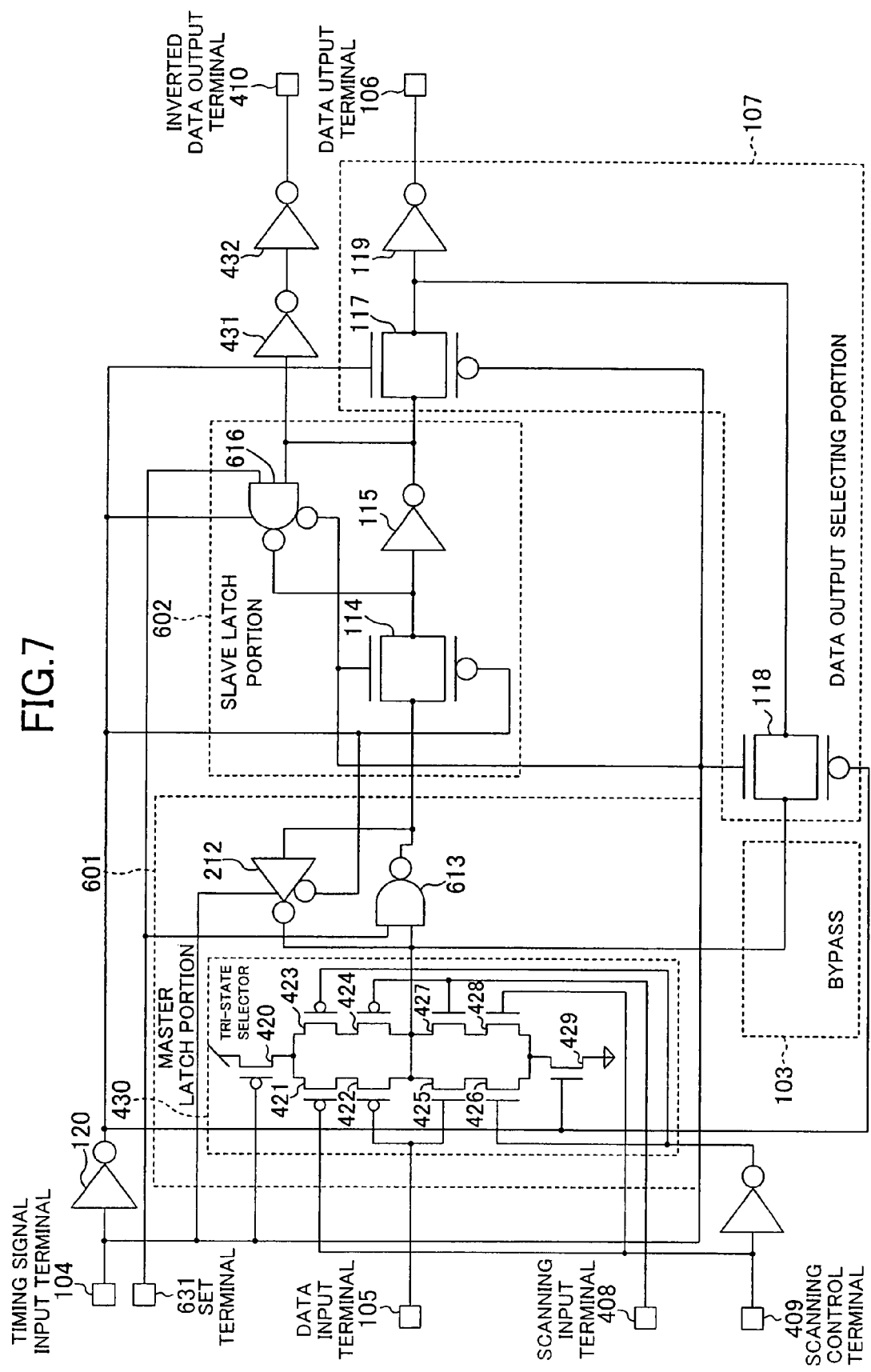
FIG. 7 is a circuit diagram illustrating a configuration of a flip-flop circuit according to a sixth embodiment.

As shown in FIG. 7, instead of the master latch portion 401 and the slave latch portion 202 of the fourth embodiment, a master latch portion 601 and a slave latch portion 602 including a NAND 613 and a tri-state NAND 616, respectively, are provided to implement a set function. With this configuration, when a set signal input from a set terminal 631 transitions to "0", set operation in which "1" is output from a data output terminal 106 is performed as in a conventional flip-flop circuit having a set function.

With the foregoing configuration, the input capacitance and the driving capability are kept constant, irrespective of the state of a timing signal, as in the fifth embodiment and other embodiments.

In the foregoing embodiments, examples of a flip-flop circuit operating at the rising edge of a timing signal have been described. Alternatively, a flip-flop circuit operating at a falling edge may be configured. Specifically, a signal input from the timing signal input terminal 104 and a signal inverted by the inverter 120 from the signal input from the timing signal input terminal 104 may be replaced with each other, for example.

To control the tri-state inverter 111 and other elements, a timing signal input from the timing signal input terminal 104 and a signal inverted by the inverter 120 from the timing signal are used as an example. However, the present invention is not limited to this. A signal inverted by the inverter 120 from the timing signal input from the timing signal input terminal 104 and a further-inverted signal thereof may be used, for example.

In the foregoing embodiments, a signal having the same logic value as that of the signal input from the data input terminal 105 when the timing signal rises is output from the data output terminal 106. Alternatively, a signal having an inverted logic value thereof may be output. Specifically, instead of the tri-state inverter 111, the inverter 119 and tri-state selector 430 for an inverted output, for example, a tri-state buffer, a buffer and a tri-state selector for a non-inverted output may be used or an odd number of inverters may be inserted.

As an element connected to the data input terminal 105, an element having a function as an inverter or an element having a function as a buffer may be used to make the input capacitance constant irrespective of the state of a timing signal as long as the data input terminal 105 is connected only to the gates of transistors constituting the element.

As described in the modified example of the fourth embodiment, an inverted signal having a small delay may be output based on the output of one of the pass gate 117 and the inverter 119 or a signal having the same logic value as that of a signal output from the data output terminal 106 may be output based on the output of the slave latch portion 102, in the fifth and sixth embodiments. In the first through third embodiments, a signal having the same logic value as that of a signal output from the data output terminal 106 and having a small delay or a signal having the same or inverted logic value and having a relatively large delay may be output in the same manner.

In the fifth or sixth embodiment, the reset state or the set state is established when a signal at the reset terminal 531 or the set terminal 631 is "0". However, the present invention is not limited to this, and the reset state or the set state may be established when the signal is "1".

In addition, components of the foregoing embodiments and modified examples may be variously combined in an allowable range. Specifically, the data output selecting portion 307 including the tri-state inverters 317 and 318 of the third embodiment (FIG. 3) may be applied to the configuration of the second embodiment (FIG. 2) in which the master latch portion 201 and the slave latch portion 202 including the tri-state inverters 212 and 216, respectively, are used. Alternatively, the configurations of the fifth and sixth embodiments (FIGS. 6 and 7) may be combined together to configure a flip-flop circuit enabling both reset and set. The configuration enabling reset and/or set may be applied to the configurations of the first through third embodiments.

The flip-flop circuit including no bypass as described above may be configured by using a tri-state element, for example, at the input of the master latch portion such that the input capacitance does not depend on a timing signal.

As described above, the flip-flop circuit according to the present invention has an advantage in which physical characteristics at the input and output terminals of the flip-flop circuit are kept constant irrespective of the state of a timing signal such as a clock signal. This flip-flop circuit is useful as a flip-flop circuit constituted by transistors formed as a semiconductor integrated circuit, for example.

What is claimed is:

1. A flip-flop circuit comprising:
   an input terminal to which an input signal is input,
   a master latch portion for holding a signal input from the input terminal immediately before a timing signal changes from a first state to a second state, while the timing signal is in the second state;
   a slave latch portion for holding a signal input from the master latch portion immediately before the timing signal changes from the second state to the first state, while the timing signal is in the first state;
   an output terminal from which one of a signal according to a signal held in the master latch portion and a signal according to a signal held in the slave latch portion is output; and
   a selecting portion for selecting a signal according to a signal held in the master latch portion when the timing signal is in the second state, selecting a signal according to a signal held in the slave latch portion when the timing signal is in the first state, and causing the selected signal to be output from the output terminal,
   wherein an input capacitance at the input terminal and a driving capability at the output terminal when the timing signal is in the first state are equal to those when the timing signal is in the second state, and
   wherein the selecting portion includes:
   a first tri-state element for outputting a signal according to a signal held in the master latch portion when the timing signal is in the second state and setting an output thereof in a high-impedance state when the timing signal is in the first state; and
   a second tri-state element for outputting a signal according to a signal held in the slave latch portion when the timing signal is in the first state and setting an output thereof in a high-impedance state when the timing signal is in the second state,
   wherein the outputs of the first and second tri-state elements are connected to the output terminal, and
   a driving capability of the first tri-state element when the timing signal is in the second state is equal to that of the second tri-state element when the timing signal is in the first state.

2. The flip-flop circuit of claim 1, wherein circuit characteristics are extracted as those of a standard cell for use in a cell-base design.

3. The flip-flop circuit of claim 1, wherein the first and second tri-state elements are tri-state inverters.

4. The flip-flop circuit of claim 1, wherein a gate of a transistor is electrically connected to the input terminal both when the timing signal is in the first state and when the timing signal is in the second state.

5. The flip-flop circuit of claim 1, wherein the master latch portion is a tri-state element controlled according to the timing signal, and
the input terminal is connected to the tri-state element.

6. The flip-flop circuit of claim 5, wherein the tri-state element is a tri-state inverter.

7. A flip-flop circuit comprising:
   an input terminal to which an input signal is input,
   a master latch portion for holding a signal input from the input terminal immediately before a timing signal changes from a first state to a second state, while the timing signal is in the second state;
   a slave latch portion for holding a signal input from the master latch portion immediately before the timing signal changes from the second state to the first state, while the timing signal is in the first state;
   an output terminal from which one of a signal according to a signal held in the master latch portion and a signal according to a signal held in the slave latch portion is output; and
   a selecting portion for selecting a signal according to a signal held in the master latch portion when the timing signal is in the second state, selecting a signal according to a signal held in the slave latch portion when the timing signal is in the first state, and causing the selected signal to be output from the output terminal, wherein an input capacitance at the input terminal and a driving capability at the output terminal when the timing signal is in the first state are equal to those when the timing signal is in the second state, and wherein the selecting portion includes:

a first tri-state element for outputting a signal according to a signal held in the master latch portion when the timing signal is in the second state and setting an output thereof in a high-impedance state when the timing signal is in the first state;

a second tri-state element for outputting a signal according to a signal held in the slave latch portion when the timing signal is in the first state and setting an output thereof in a high-impedance state when the timing signal is in the second state; and a driver for receiving output signals from the first and second tri-state elements and outputting a signal to the output terminal.

8. The flip-flop circuit of claim 7, wherein the first and second tri-state elements are tri-state inverters.

9. The flip-flop circuit of claim 7, wherein the driver is an inverter.

* * * * *